United States Patent
Lee

(10) Patent No.: US 10,892,759 B1
(45) Date of Patent: Jan. 12, 2021

(54) BUS DRIVER MODULE WITH CONTROLLED CIRCUIT AND TRANSITION CONTROLLED CIRCUIT THEREOF

(71) Applicant: AMAZING MICROELECTRONIC CORP., New Taipei (TW)

(72) Inventor: Che-Cheng Lee, Zhubei (TW)

(73) Assignee: Amazing Microelectronic Corp., New Taipei (TW)

( * ) Notice: Subject to any disclaimer, the term of this patent is extended or adjusted under 35 U.S.C. 154(b) by 0 days.

(21) Appl. No.: 16/794,453

(22) Filed: Feb. 19, 2020

(51) Int. Cl.
| H03K 19/0185 | (2006.01) |
| H03K 5/13 | (2014.01) |
| H04L 12/40 | (2006.01) |
| H03K 19/20 | (2006.01) |

(52) U.S. Cl.
CPC ........... *H03K 19/0185* (2013.01); *H03K 5/13* (2013.01); *H04L 12/40013* (2013.01); *H03K 19/20* (2013.01); *H04L 2012/40215* (2013.01)

(58) Field of Classification Search
CPC ...... H03K 19/0185; H03K 5/13; H03K 19/20; H04L 12/40013; H04L 2012/40215
USPC ........................................................ 326/87
See application file for complete search history.

(56) References Cited

U.S. PATENT DOCUMENTS

| 6,154,061 | A | | 11/2000 | Boezen et al. |
| 6,166,971 | A | * | 12/2000 | Tamura .................... H03L 7/07 365/198 |
| 6,570,931 | B1 | * | 5/2003 | Song ................. H04L 25/03885 327/108 |
| 7,595,674 | B1 | * | 9/2009 | Cetin .................. G06F 13/4072 326/82 |
| 8,324,935 | B2 | | 12/2012 | Boezen |
| 2002/0175717 | A1 | * | 11/2002 | Ray .................. H03K 19/01858 327/108 |
| 2007/0046331 | A1 | * | 3/2007 | Kwon .............. H03K 19/00346 326/83 |
| 2007/0103186 | A1 | * | 5/2007 | Clements ............ H04L 25/0278 326/30 |
| 2008/0122478 | A1 | * | 5/2008 | Mei ...................... G11C 11/4074 326/27 |
| 2010/0201399 | A1 | * | 8/2010 | Metzner ................ H04L 25/028 326/83 |
| 2011/0012661 | A1 | * | 1/2011 | Binder ............... H01R 13/7177 327/276 |

(Continued)

*Primary Examiner* — Don P Le
(74) *Attorney, Agent, or Firm* — Rosenberg, Klein & Lee

(57) ABSTRACT

A bus driver module with controlled circuit is connected to a controller area network bus for generating a high side output or a low side output, comprising a transition controlled circuit and an output driver. The transition controlled circuit comprises a first pathway controlled unit connected in parallel with a second pathway controlled unit for generating a side switching voltage. The output driver is connected in series with the transition controlled circuit and receives the side switching voltage so as to accordingly generate the output bus signal. Each of the first and second pathway controlled unit comprises a plurality of switches and can be activated depending on an input signal. By controlling the switches of the first or second pathway controlled unit to be sequentially turned on and off successively, the side switching voltage is characterized by a smooth phase transition, low common mode noise and better EMI performances.

28 Claims, 12 Drawing Sheets

(56) References Cited

U.S. PATENT DOCUMENTS

| | | | |
|---|---|---|---|
| 2015/0169488 A1* | 6/2015 | Metzner | G06F 13/4022 |
| | | | 710/316 |
| 2015/0229408 A1* | 8/2015 | Ding | H04B 10/5161 |
| | | | 398/188 |
| 2016/0094362 A1* | 3/2016 | Brennan | H03K 3/012 |
| | | | 327/109 |
| 2019/0272248 A1* | 9/2019 | Metzner | H04B 3/06 |

* cited by examiner

BUS DRIVER MODULE WITH CONTROLLED CIRCUIT AND TRANSITION CONTROLLED CIRCUIT THEREOF

BACKGROUND OF THE INVENTION

Field of the Invention

The present invention is related to a control circuit, and more particularly to a transition controlled circuit which is employed with multiple phase accelerating transition and smoothing transition for controller area network bus application systems.

Description of the Prior Art

As known, controller area network (CAN) is a kind of specification established in early 1990's, got standardized as ISO 11898-1 in 1993, and widely used in all kinds of vehicles and electronic devices later on. In general, controller area network includes a serial bus, which provides high security level and efficient real time control. Also, it is able to ensure debugging and priority determining mechanism, thereby making transmissions for internet messages much more reliable and efficient than ever. From such a point of view, it is believed that the controller area network nowadays is not only characterized by highly flexible adjustment ability which can accommodate more station numbers in existed internet without modifying its software and/or hardware, but also enhances network upgrading conveniences since its data transmission path do not need to build upon certain specific standard stations.

Please refer to FIG. 1, which is a schematic drawing of a conventional controller area network bus transmitter (TX) architecture, wherein an input voltage $V_{in}$ is processed though a pre-driver 11 and an output driver 12 at a high side so as to generate an output voltage $V_{out}$ as a high side output CANH. Similarly, the input voltage $V_{in}$ is processed though a pre-driver 21 and an output driver 22 at a low side so as to generate an output voltage $V_{out}$ as a low side output CANL.

FIG. 2 shows a wave form of the conventional controller area network bus transmitter (TX) architecture with respect with FIG. 1. As can be seen in FIG. 2, the high side output CANH and the low side output CANL are utilized to provide a pair of differential signals. In the digital logic design nowadays, for example as shown in FIG. 2, when the high side output CANH and the low side output CANL are both 2.5V (assumed the supply voltage is 5V), it represents the transmitter transmitting a logic of "High". On the other hand, when the high side output CANH is raised, for example, to 3.5V and the low side output CANL is lowered, for example, to 1.5V, it represents the transmitter transmitting a logic of "Low". It is always critical to design the electrical circuits and maintain a DC stability of the high side output CANH and the low side output CANL so as to achieve a decent Electromagnetic Interference (EMI) performance.

Moreover, the transmitter of high speed controller area network (HS-CAN) is preferably requested to provide a high data rate as well as low EMI performance at the same time. In the bus transition either from a recessive mode to a dominant mode (OFF to ON) or from a dominant mode to a recessive mode (ON to OFF), the bus signals CANH and CANL generated by the transmitter must have a controlled slew rate to get low common mode noise so that the EMI performance will be better. Also, the voltage level of the bus signals CANH and CANL have to reach their individual stable state in a short bit time. Hence, it is believed that the pre-driver of the transmitter architecture must have multiple phases to control the bus driver. An U.S. Pat. No. 6,154,061 discloses a CAN bus driver with symmetrical differential output signals having an optimum symmetry, and another U.S. Pat. No. 8,324,935 discloses a bus driver circuit for driving a bus voltage. Among these two prior arts, multi-phase design for accelerating transition is proposed, though. Nevertheless, none of these disclose any techniques for such a smooth transition. That is to say, when it comes to a bus transition period, a turning point of the transition would be too sharp, leading to a bad EMI performance.

Furthermore, as for the U.S. Pat. No. 6,154,061, since the transistors employed in such design are most likely to be able to enter a saturation region, the asymmetry of its output signals always occurs and becomes inevitable due to a process variation of the transistors. Under such circumstances, it in view of all, should be apparent and obvious that there is indeed an urgent need for the professionals in the field for a novel and inventive bus driver control circuit to be developed so as to achieve the purpose of multiple phase accelerating transition and smoothing transition for controller area network bus applications.

SUMMARY OF THE INVENTION

In order to overcome the above mentioned disadvantages, one major objective in accordance with the present invention is provided for a novel and creative transition controlled circuit which can successfully solves the problems of prior arts and achieve precise control ability for output DC voltage level as well as multiple phase accelerating transition and smoothing transition for controller area network bus application systems.

Another objective in accordance with the present invention is provided for a novel bus driver module with controlled circuit, in which the proposed transition controlled circuit is applied to. By integrating the transition controlled circuit with the conventional pre-driver architecture, the newly designed pre-driver of a transmitter architecture is aimed to have multiple phases to control the bus driver.

And yet another objective in accordance with the present invention is provided for a bus driver module with controlled circuit and its transition controlled circuit thereof, in which the all new pre-driver architecture is proposed not only to have multiple phases to control the bus driver, but also to get a smooth transition output of the pre-driver in the transition of the two phases. Meanwhile, the proposed pre-driver not only makes the output signal CANH and CANL reach their stable state in a short bit time, but also has verified to get low common mode noise and better EMI performance.

For achieving the above mentioned objectives, the present invention provides a transition controlled circuit, which is electrically connected to an input terminal and comprising a first pathway controlled unit connected in parallel with a second pathway controlled unit for generating a side switching voltage. Each of the first pathway controlled unit and the second pathway controlled unit comprise a plurality of switches.

An output driver is electrically connected in series with the transition controlled circuit and receives the side switching voltage so as to accordingly generate an output bus signal for controller area network bus systems. According to the present invention, the generated output bus signal for the controller area network bus can be either a high side output (CANH) or a low side output (CANL).

An input signal is injected through the input terminal, so either the first pathway controlled unit or the second pathway controlled unit will be active, and the plurality of switches of either the first pathway controlled unit or the second pathway controlled unit will be sequentially turned on such that the side switching voltage encounters a smooth phase transition.

According to a preferred embodiment of the present invention, each the first pathway controlled unit and the second pathway controlled unit comprises a main switch and multiple auxiliary switches which are connected in parallel. Each of the main switch and the auxiliary switches can be further connected to an impedance component. The main switch of the first pathway controlled unit and of the second pathway controlled unit is aimed to control whether the first pathway controlled unit or the second pathway controlled unit can be active, depending on a high voltage level or low voltage level of the input signal. After either one of the first and second pathway controlled unit is active due to an on state of its main switch, its connected auxiliary switches will be turned on sequentially such that a voltage value of the side switching voltage varies in a first phase state.

Later, the auxiliary switches will be turned off sequentially such that the voltage value of the side switching voltage varies from the foregoing first phase state to a second phase state, and such phase transition between the first phase state and the second phase state is smooth.

In another aspect, a plurality of control signals can be generated through at least one switch control circuit for controlling the auxiliary switches to turn on and turn off sequentially. The switch control circuit can be configured between the input terminal and the first pathway controlled unit such that its generated control signals can be transmitted to determines an on and off state of each of the auxiliary switches in the first pathway controlled unit. Similarly, the switch control circuit can be also configured between the input terminal and the second pathway controlled unit such that its generated control signals can be transmitted to determines an on and off state of each of the auxiliary switches in the second pathway controlled unit.

By such designed arrangements, these auxiliary switches either in the first pathway controlled unit or in the second pathway controlled unit can be controlled accurately such that the side switching voltage is characterized by a smooth phase transition.

In one embodiment of the present invention, the switch control circuit is composed of a pulse generator and a pulse sequential delay circuit in series connection with the pulse generator. The pulse generator receives the input signal and outputs a pulse signal, the pulse sequential delay circuit receives the pulse signal and outputs the plurality of control signals for controlling each of the corresponding auxiliary switches accordingly.

In one embodiment, the pulse sequential delay circuit may comprise multiple delay units, and each of the delay units outputs one of the control signals for controlling a corresponding auxiliary switch. The delay unit, for example, can be a buffer.

Based on the above, the present invention is well designed and indeed discloses a novel bus driver module with controlled circuit and its transition controlled circuit thereof. The whole new schemes can be employed in a pre-driver architecture, which is proposed not only to have multiple phases to control a bus driver, but also to get a smooth transition output of the pre-driver in the transition of the two phases. Meanwhile, the proposed pre-driver scheme has verified to get low common mode noise and better EMI performance. Thus, it is believed that the present invention is advantageous of having excellent control stability over CANH and CANL voltage signals for system levels as well as maintaining precise control ability to the DC output levels when compared to the prior arts.

These and other objectives of the present invention will become obvious to those of ordinary skill in the art after reading the following detailed description of preferred embodiments.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
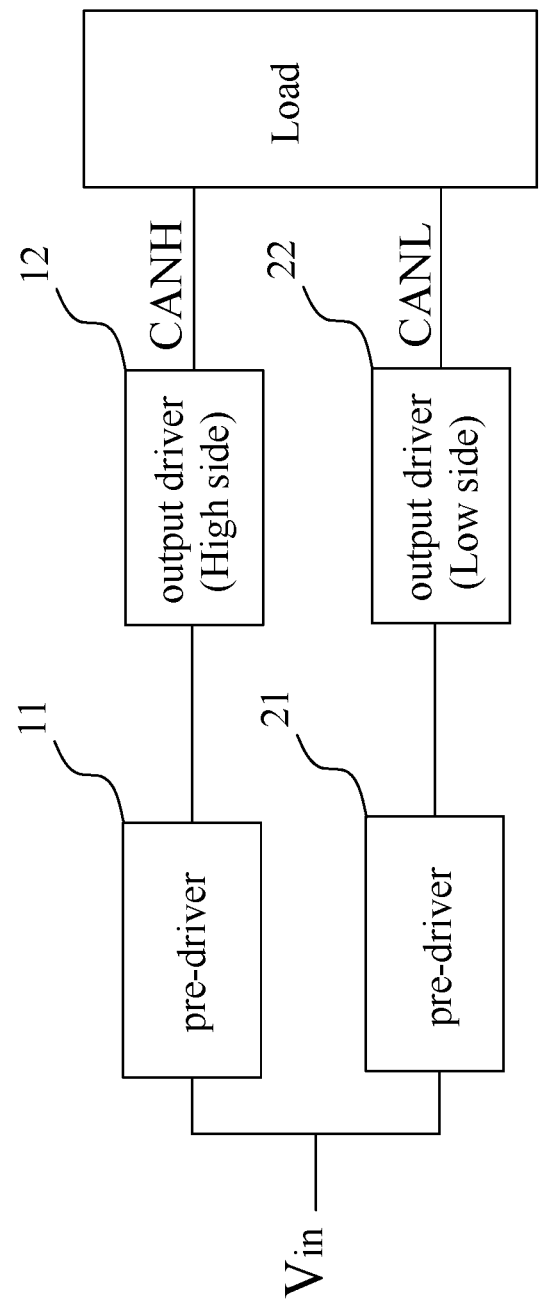
FIG. 1 shows a schematic drawing of a conventional controller area network bus transmitter (TX) architecture.
Figure 2:
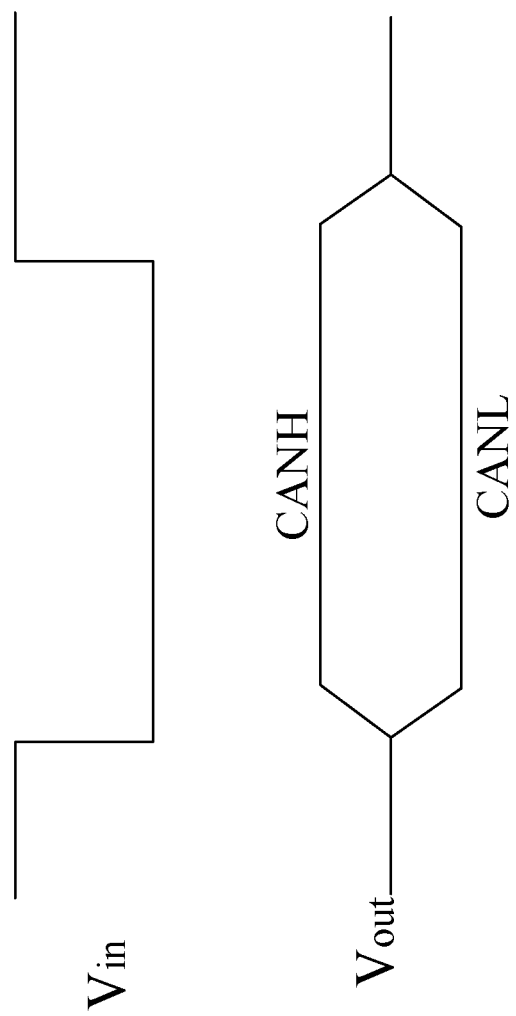
FIG. 2 shows a wave form of the conventional controller area network bus transmitter (TX) architecture with respect with FIG. 1.

Reference will now be made in detail to the preferred embodiments of the present invention, examples of which are illustrated in the accompanying drawings. Wherever possible, the same reference numbers are used in the drawings and the description to refer to the same or like parts.

The embodiments described below are illustrated to demonstrate the technical contents and characteristics of the present invention and to enable the persons skilled in the art to understand, make, and use the present invention. However, it shall be noticed that, it is not intended to limit the scope of the present invention. Therefore, any equivalent modification or variation according to the spirit of the present invention is to be also included within the scope of the present invention.

Figure 3:
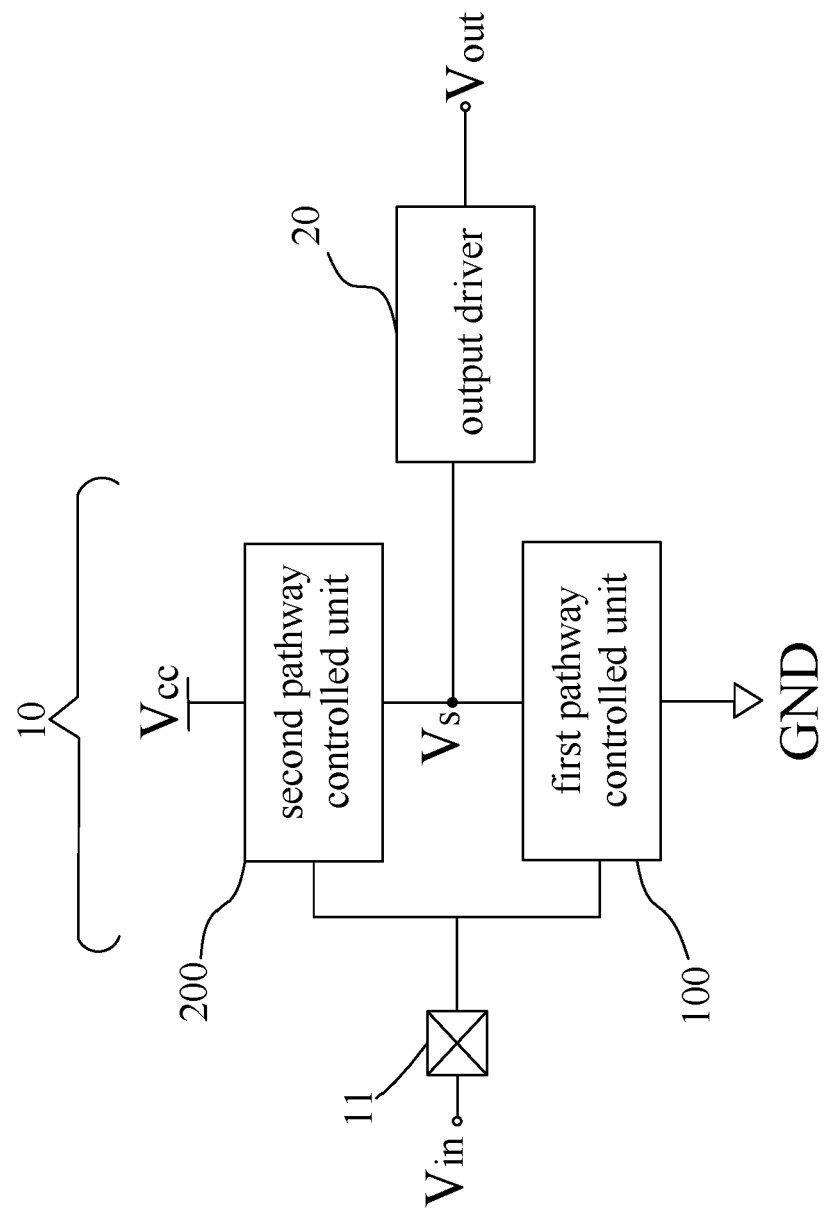
FIG. 3 shows a block diagram of a bus driver module with controlled circuit in accordance with one embodiment of the present invention.

Please refer to FIG. 3, which shows a block diagram of a bus driver module with controlled circuit in accordance with one embodiment of the present invention. As shown in FIG. 3, the bus driver module with controlled circuit disclosed by the present invention is electrically connected to a controller area network bus (CAN BUS) for providing an output bus signal $V_{out}$, and the output bus signal $V_{out}$ of the controller area network bus is aimed to serve as a pair of differential signals through a high side output CANH and a low side output CANL.

According to the embodiment of the present invention, the proposed bus driver module mainly comprises a transition controlled circuit 10 and an output driver 20, wherein the transition controlled circuit 10 is electrically connected to an input terminal 11 and comprising a first pathway controlled unit 100 connected in parallel with a second pathway controlled unit 200. A side switching voltage $V_s$ is generated there in between the first pathway controlled unit 100 and the second pathway controlled unit 200.

The first pathway controlled unit 100 is connected between the input terminal 11, the side switching voltage $V_s$ and a ground voltage GND. The second pathway controlled unit 200 is connected between a supply voltage $V_{cc}$, the input terminal 11, and the side switching voltage $V_s$.

According to the embodiment of the present invention, when an input signal is injected through the input terminal 11, it is designed that either the first pathway controlled unit 100 or the second pathway controlled unit 200 will be active according to a rising edge or a falling edge and/or a high voltage level or a low voltage level of the input signal. When the input signal is a high voltage level, the first pathway controlled unit 100 is active, and the second pathway controlled unit 200 is not active. On the contrary, when the input signal is a low voltage level, the first pathway controlled unit 100 is not active, and the second pathway controlled unit 200 is active. In order to get deep into the technical features of the proposed circuit module of the present invention, for more detailed descriptions, please find referring as to FIG. 4 at the same time.

Figure 4:
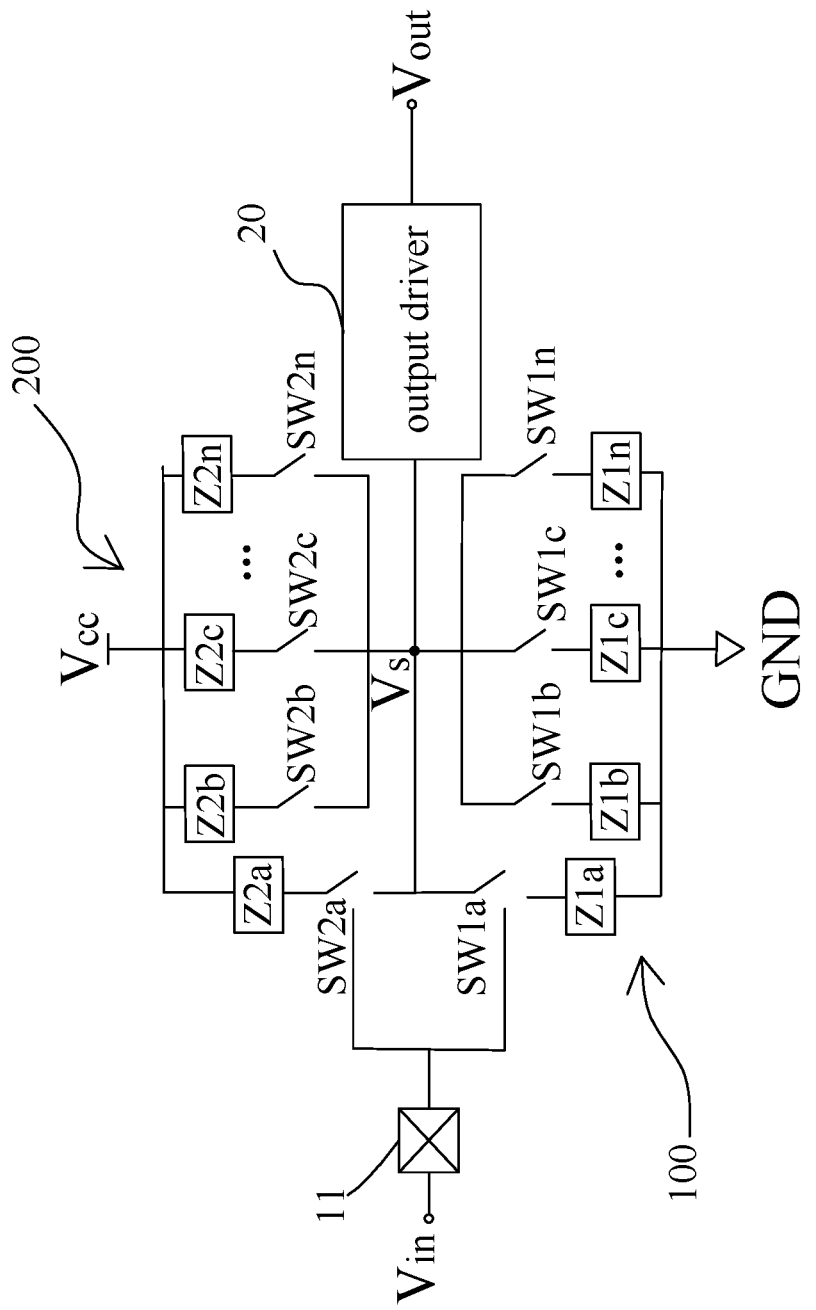
FIG. 4 shows a detailed illustration of the circuit diagram of a bus driver module with controlled circuit in accordance with one embodiment of the present invention as shown in FIG. 3.

FIG. 4 shows a detailed illustration of the circuit diagram of a bus driver module with controlled circuit in accordance with one embodiment of the present invention as shown in FIG. 3. As can be seen, the first pathway controlled unit 100 is connected between the input terminal 11, the side switching voltage $V_s$ and a ground voltage GND and comprises at least one first main switch SW1a and multiple first auxiliary switches SW1b, SW1c . . . SW1n, which are connected in parallel with each other.

In one embodiment, each of the first main switch SW1a and the first auxiliary switches SW1b, SW1c . . . SW1n is further connected to an impedance component Z1a, Z1b, Z1c . . . Z1n. According to the embodiment of the present invention, the impedance component Z1a, Z1b, Z1c . . . Z1n can be selectively designed through passive load circuits, i.e. RLC networks or current source loads, and so on.

Similarly, the second pathway controlled unit 200 is connected between the input terminal 11, the side switching voltage $V_s$ and the supply voltage $V_{cc}$ and comprises at least one second main switch SW2a and multiple second auxiliary switches SW2b, SW2c . . . SW2n, which are connected in parallel with each other.

Each of the second main switch SW2a and the second auxiliary switches SW2b, SW2c . . . SW2n is further connected to an impedance component Z2a, Z2b, Z2c . . . Z2n. According to the embodiment of the present invention, the impedance component Z2a, Z2b, Z2c . . . Z2n in the same manners as the aforesaid impedance component Z1a, Z1b, Z1c . . . Z1n, can be also selectively designed through passive load circuits or active load circuits, i.e. RLC networks or current source loads, and so on.

Affirmatively, regarding to the kinds and components of the impedance circuit as well as the number of switches being disposed in the circuit diagram, people who are skilled in the art and having understandings and technical backgrounds to the present invention are allowed to make various modifications or changes depending on different circuit regulations and/or specifications without departing from the scope of the invention. The present invention is not limited thereto.

The output driver 20 is connected in series with the transition controlled circuit 10 and receives the side switching voltage $V_s$ so as to accordingly generate the aforesaid output bus signal $V_{out}$, i.e. the high side output CANH or the low side output CANL.

For achieving the objectives of the present invention, according to the embodiment of the present invention, it is sophisticatedly design that the plurality of switches of either the first pathway controlled unit 100, i.e. SW1b, SW1c . . . SW1n, or the plurality of switches of the second pathway controlled unit 200, i.e. SW2b, SW2c . . . SW2n, will be sequentially turned on and then turned off. By such arrangements, the side switching voltage $V_s$ encounters multiple phases and the phase transition can be smooth.

Figure 5:
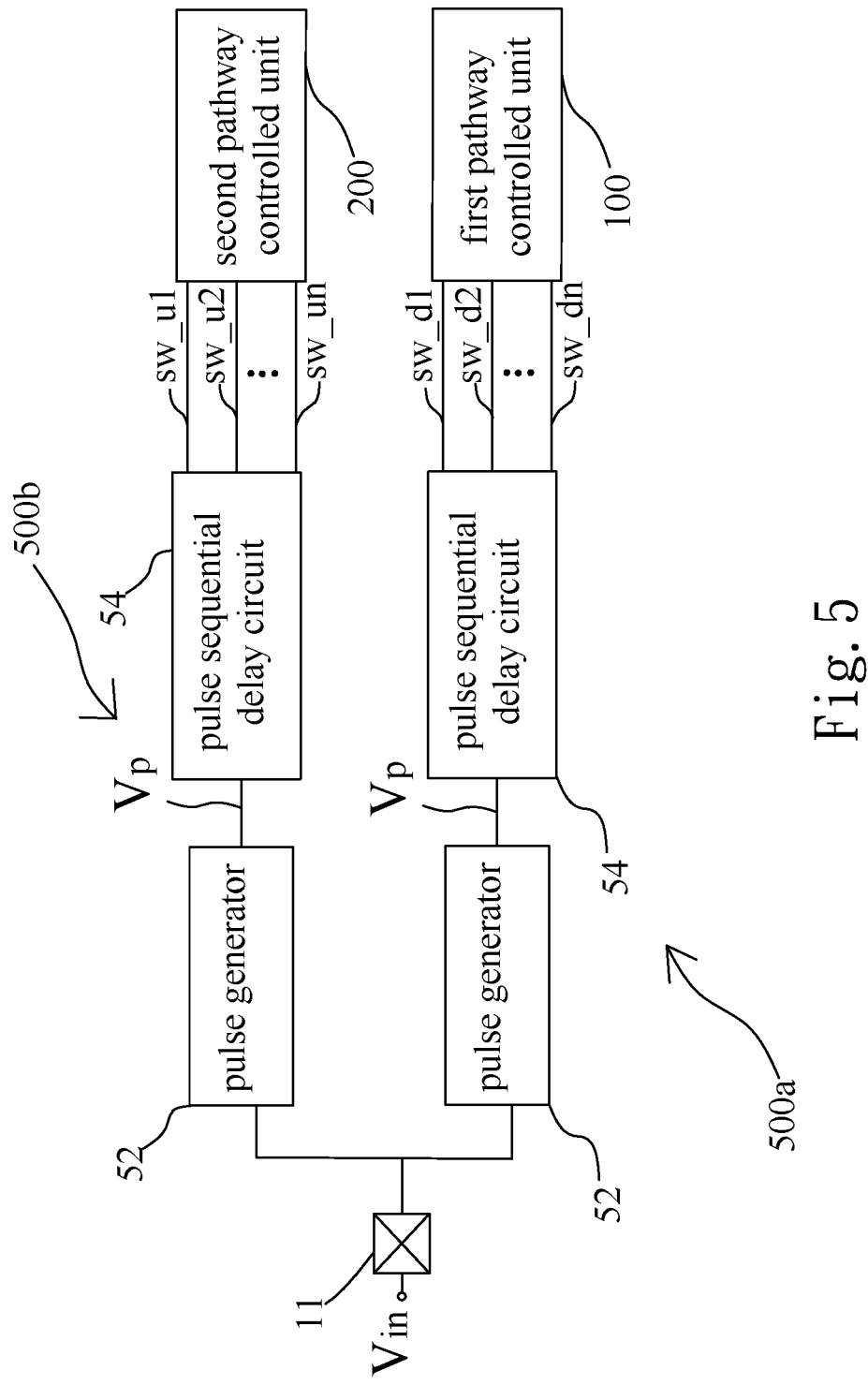
FIG. 5 shows a block diagram of a bus driver module with controlled circuit in view of at least one switch control circuit in accordance with the preferred embodiment of the present invention.

Please refer to FIG. 5, which shows a block diagram of a bus driver module with controlled circuit in view of at least one switch control circuit in accordance with the preferred embodiment of the present invention. As seen from FIG. 4 and FIG. 5, it explains well how the plurality of first auxiliary switches SW1b, SW1c . . . SW1n and second auxiliary switches SW2b, SW2c . . . SW2n are controlled.

It can be observed that a switch control circuit 500a is electrically connected between the input terminal 11 and the first pathway controlled unit 100, and the switch control circuit 500a is composed of a pulse generator 52 and a pulse sequential delay circuit 54 in series connection with said pulse generator 52. The pulse generator receives the input signal $V_{in}$ from the input terminal 11 and outputs a pulse signal $V_p$, the pulse sequential delay circuit 54 receives the pulse signal $V_p$ and outputs a plurality of first control signals sw_d1, sw_d2 . . . sw_dn, wherein each of the first control signals sw_d1, sw_d2 . . . sw_dn determines and controls an on and off state of each of the first auxiliary switches SW1b, SW1c . . . SW1n.

For example, the first control signal sw_d1 is connected to the first auxiliary switch SW1b, and controls the first auxiliary switch SW1b; the first control signal sw_d2 is connected to the first auxiliary switch SW1c, and controls the first auxiliary switch SW1c . . . ; and the first control signal sw_dn is connected to the first auxiliary switch SW1n, and controls the first auxiliary switch SW1n.

Similarly, the switch control circuit 500b is electrically connected between the input terminal 11 and the second pathway controlled unit 200, and the switch control circuit 500b is composed of a pulse generator 52 and a pulse sequential delay circuit 54 in series connection with said pulse generator 52. The pulse generator receives an input signal $V_{in}$ from the input terminal 11 and outputs a pulse signal $V_p$, the pulse sequential delay circuit 54 receives the pulse signal $V_p$ and outputs a plurality of second control signals sw_u1, sw_u2 . . . sw_un, wherein each of the second control signals sw_u1, sw_u2 . . . sw_un determines and controls an on and off state of each of the second auxiliary switches SW2b, SW2c . . . SW2n.

For example, the second control signal sw_u1 is connected to the second auxiliary switch SW2b, and controls the second auxiliary switch SW2b; the second control signal sw_u2 is connected to the second auxiliary switch SW2c, and controls the second auxiliary switch SW2c . . . ; and the second control signal sw_un is connected to the second auxiliary switch SW2n, and controls the second auxiliary switch SW2n.

Since the switch control circuits 500a and 500b are schematically similar, we simply take one of these, i.e. the switch control circuit 500a as an explanatory embodiment for further discussions. Please find FIG. 6, which shows a detailed circuit diagram of the switch control circuit 500a in accordance with one embodiment of the present invention. As shown, the pulse generator 52 comprises an inverter 521, a capacitor 523, a comparator 525 and an AND gate 527, wherein a first end of the inverter 521 is electrically connected to the input terminal 11 and receives the input signal $V_{in}$. A second end of the inverter 521 is electrically connected to the capacitor 523. Two input ends of the comparator 525 are respectively connected to the capacitor 523 and a reference voltage $V_{ref}$ to have it output connected to the AND gate 527. The other input end of the AND gate 527 is directly connected to the input terminal 11 for receiving the input signal $V_{in}$. As such, when the input signal $V_{in}$ is at a high voltage level, the inverter 521 slowly discharges the capacitor 523 until its voltage charge becomes lower than the reference voltage $V_{ref}$, so an output of the comparator 525 turns from a high level to low level. At this time, the output of the comparator is then sent together with the input signal $V_{in}$ into the AND gate 527, whereby generating a pulse signal $V_p$.

Moreover, since the pulse sequential delay circuit 54 is composed of multiple delay units 541, for example, the delay unit 541 considered as a buffer, after the pulse signal $V_p$ is generated and transmitted into the pulse sequential delay circuit 54, each of the delay units 541 is able to accordingly output one of the first control signals sw_d1, sw_d2 . . . sw_dn for individually controlling the corresponding first auxiliary switch SW1b, SW1c . . . SW1n.

That is to say, the first control signal sw_d1 is connected to the first auxiliary switch SW1b, and controls the first auxiliary switch SW1b; the first control signal sw_d2 is connected to the first auxiliary switch SW1c, and controls the first auxiliary switch SW1c . . . ; and the first control signal sw_dn is connected to the first auxiliary switch SW1n, and controls the first auxiliary switch SW1n.

In the same manners, as for the switch control circuit 500b composed of the pulse generator 52 and the pulse sequential delay circuit 54, after the pulse signal $V_p$ is generated through the pulse generator 52 and transmitted into the pulse sequential delay circuit 54, each of the delay units 541 is able to accordingly output one of the second control signals sw_u1, sw_u2 . . . sw_un for individually controlling the corresponding second auxiliary switch SW2b, SW2c . . . SW2n.

That is to say, the generated second control signal sw_u1 is connected to the second auxiliary switch SW2b, and controls the second auxiliary switch SW2b; the generated second control signal sw_u2 is connected to the second auxiliary switch SW2c, and controls the second auxiliary switch SW2c . . . ; and the generated second control signal sw_un is connected to the second auxiliary switch SW2n, and controls the second auxiliary switch SW2n.

Figure 6:
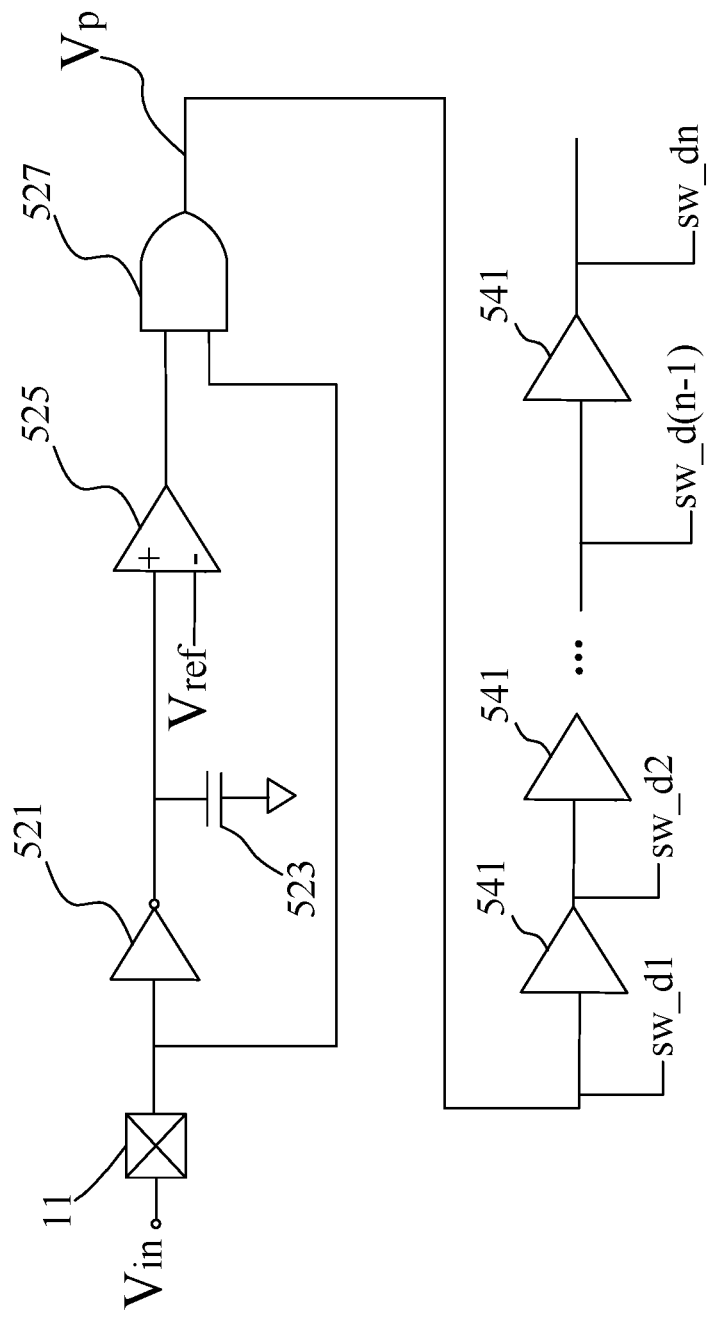
FIG. 6 shows a detailed circuit diagram of the switch control circuit in accordance with one embodiment of the present invention.
Figure 7:
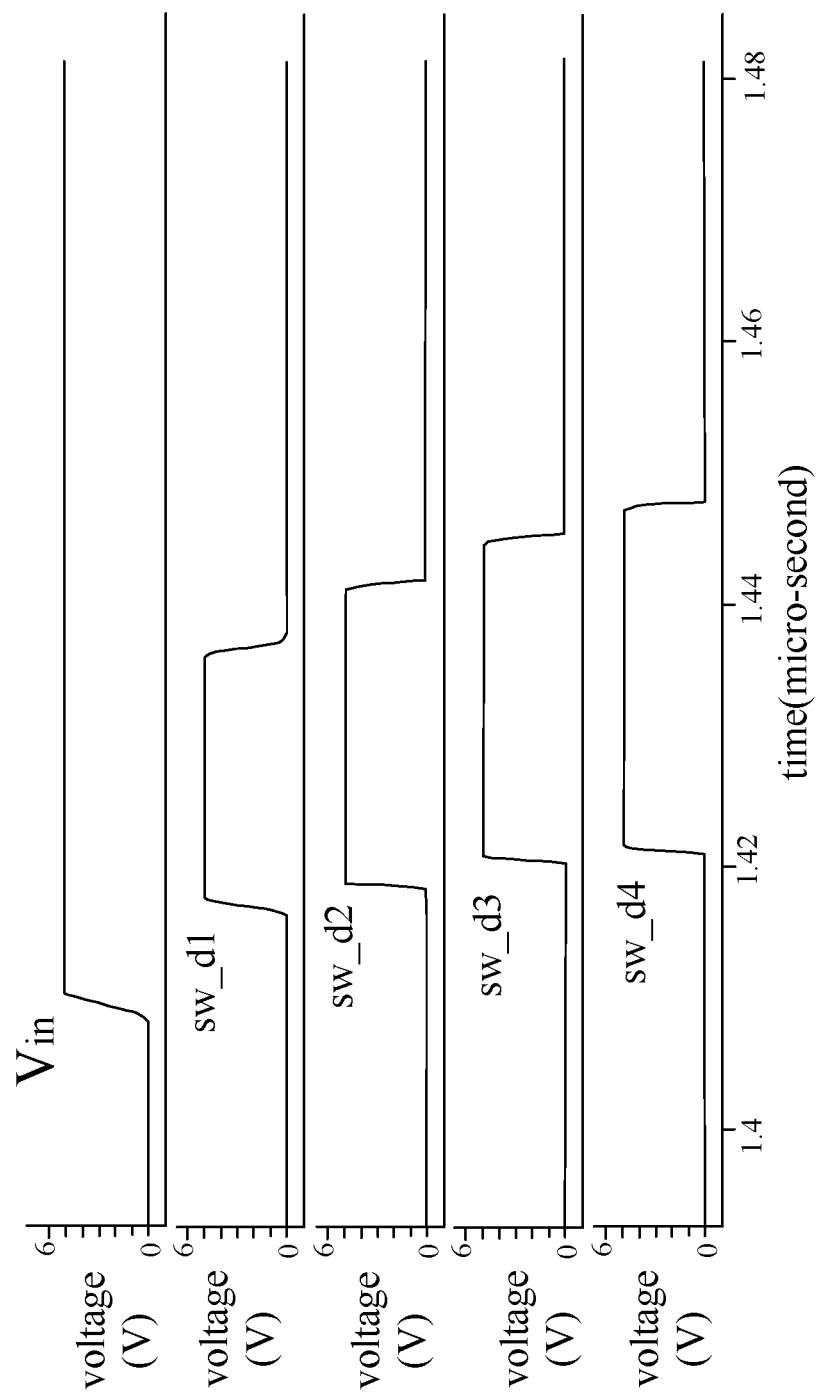
FIG. 7 shows waveforms of the voltage signals in accordance with the switch control circuit module as shown in FIG. 6 when n=4.

Please refer to FIG. 7, which shows waveforms of the voltage signals in accordance with the switch control circuit module as shown in FIG. 6 when n=4. As shown in FIG. 7, it is obvious that by employing the proposed switch control circuit structure, when the input signal $V_{in}$ is high, due to the operations performed by the pulse generator 52 and a plurality of delay unit 541, the first control signals sw_d1, sw_d2, sw_d3, sw_d4 can be generated in a row, which turn on the first auxiliary switches SW1b, SW1c, SW1d, SW1e sequentially first; and after a period of time, turning off the first auxiliary switches SW1b, SW1c, SW1d, SW1e sequentially.

Therefore, with respect with FIG. 4, when the input signal $V_1$ is injected through the input terminal 11 and at a high voltage level, the first main switch SW1a is turned on (the second main switch SW2a is OFF), so the first pathway controlled unit 100 of the transition controlled circuit is active.

Next, the first auxiliary switches SW1b, SW1c, . . . SW1n will be turned on, owing to the first control signals sw_d1, sw_d2 . . . sw_dn as described earlier in FIG. 7. As a result, a voltage level of the side switching voltage $V_s$ will drop dramatically from $V_{cc}$, so called in a first phase state. Later on, since these first auxiliary switches SW1b, SW1c, . . . SW1n will be turned off sequentially as shown in FIG. 7, the voltage level of the side switching voltage $V_s$ varies from the previous first phase state to a second phase state, which shows a slow voltage drop to the ground voltage due to a single electrical path attributed from the first main switch SW1a and its impedance component Z1a.

On the other hand, when the input signal $V_{in}$ is injected through the input terminal 11 and at a low voltage level, the second main switch SW2a is turned on (the first main switch SW1a is OFF), so the second pathway controlled unit 200 of the transition controlled circuit is active.

In the same methodology as for the first pathway controlled unit 100, the second auxiliary switches SW2b, SW2c, SW2n will be turned on, owing to the second control signals sw_u1, sw_u2 . . . sw_un generated by the switch control circuit 500b. Under such circumstances, the voltage level of the side switching voltage $V_s$ will increase dramatically from the ground voltage, so called in a first phase state. Later on, since these second auxiliary switches SW2b, SW2c, SW2n will be turned off sequentially, the voltage level of the side switching voltage $V_s$ varies from the previous first phase state to a second phase state, which shows a slow voltage raise back to $V_{cc}$ due to a single electrical path attributed from the second main switch SW2a and its impedance component Z2a. As such, the side switching voltage $V_s$ has encountered through two phase states, and between these two phase states is a phase transition.

In the following paragraphs, the present invention will be verified with experimental simulation results provided below to show that such phase transition between the foregoing first phase state and the second phase state can be smooth.

Figure 8:
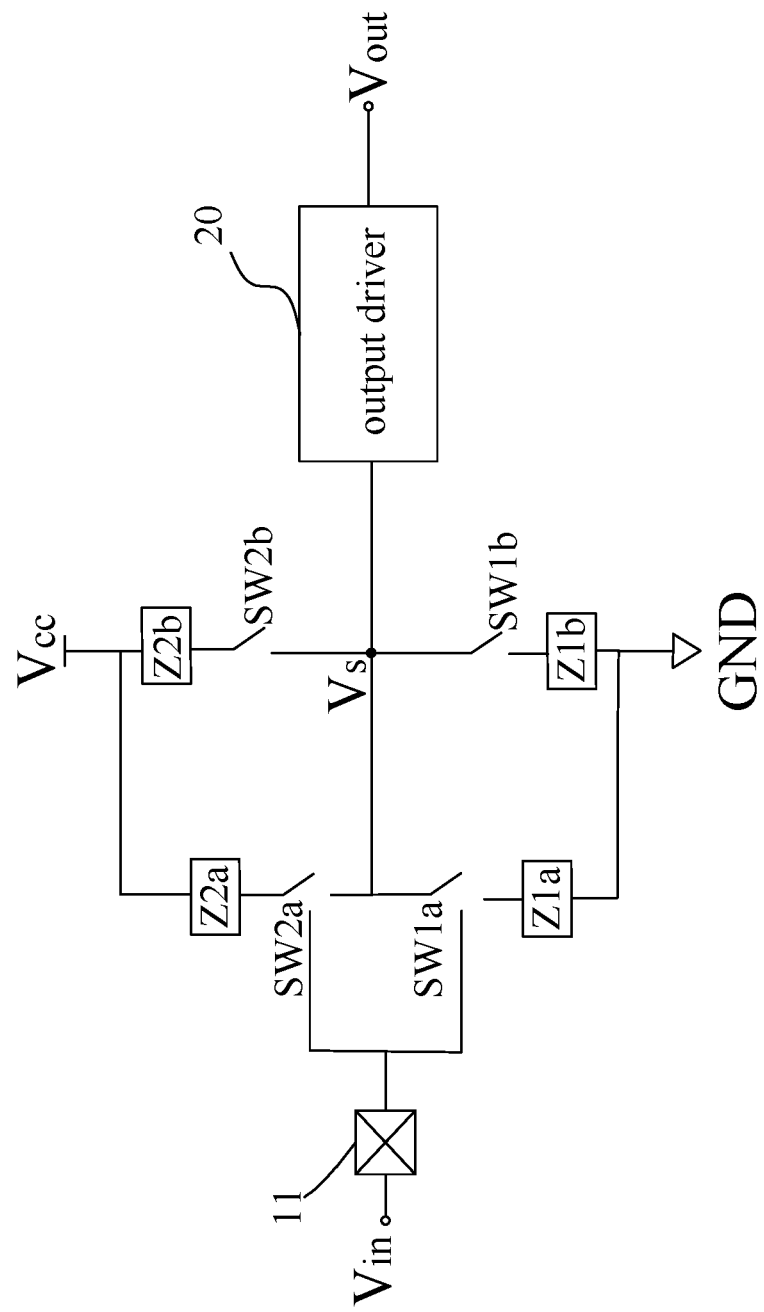
FIG. 8 shows an illustrative drawing of the circuit diagram of a bus driver module with controlled circuit in accordance with yet another embodiment of the present invention when only one first auxiliary switch and one second auxiliary switch are disposed in the first pathway controlled unit and the second pathway controlled unit, respectively.

Please refer to FIG. 8, which shows an illustrative drawing of the circuit diagram of a bus driver module with controlled circuit in accordance with yet another embodiment of the present invention. In the circuit diagram of FIG. 8, compared to the preferred embodiment provided in FIG. 4, instead of utilizing multiple auxiliary switches, only one first auxiliary switch SW1b and one second auxiliary switch SW2b are disposed in the first pathway controlled unit and the second pathway controlled unit, respectively.

Figure 9:
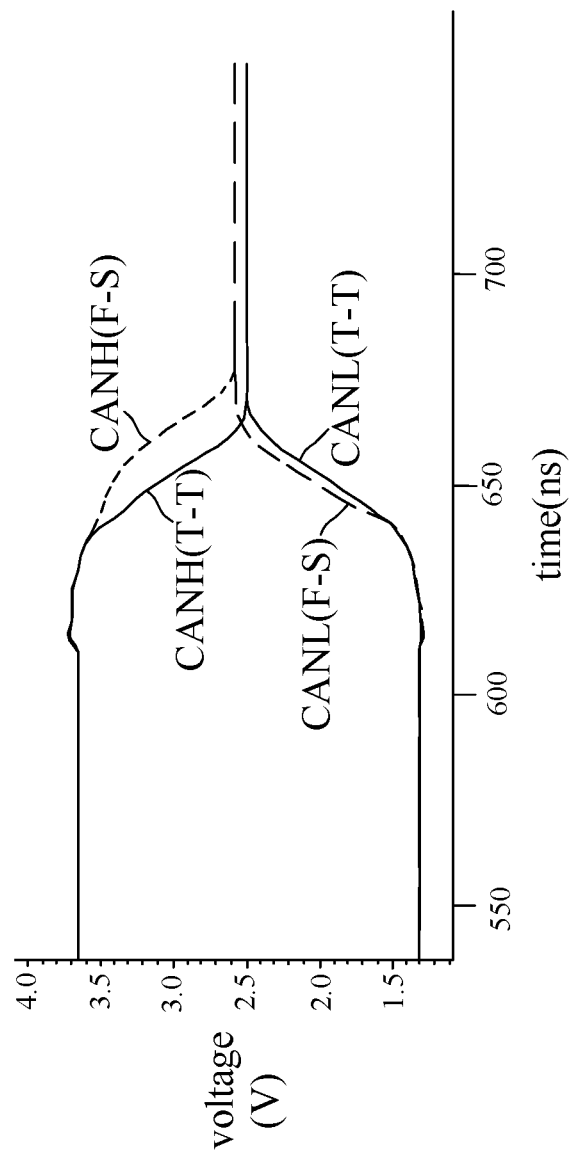
FIG. 9 shows waveforms of the output bus signal $V_{out}$ composed of a high side output CANH and a low side output CANL in FIG. 8 in which a process variation occurs.
Figure 10:
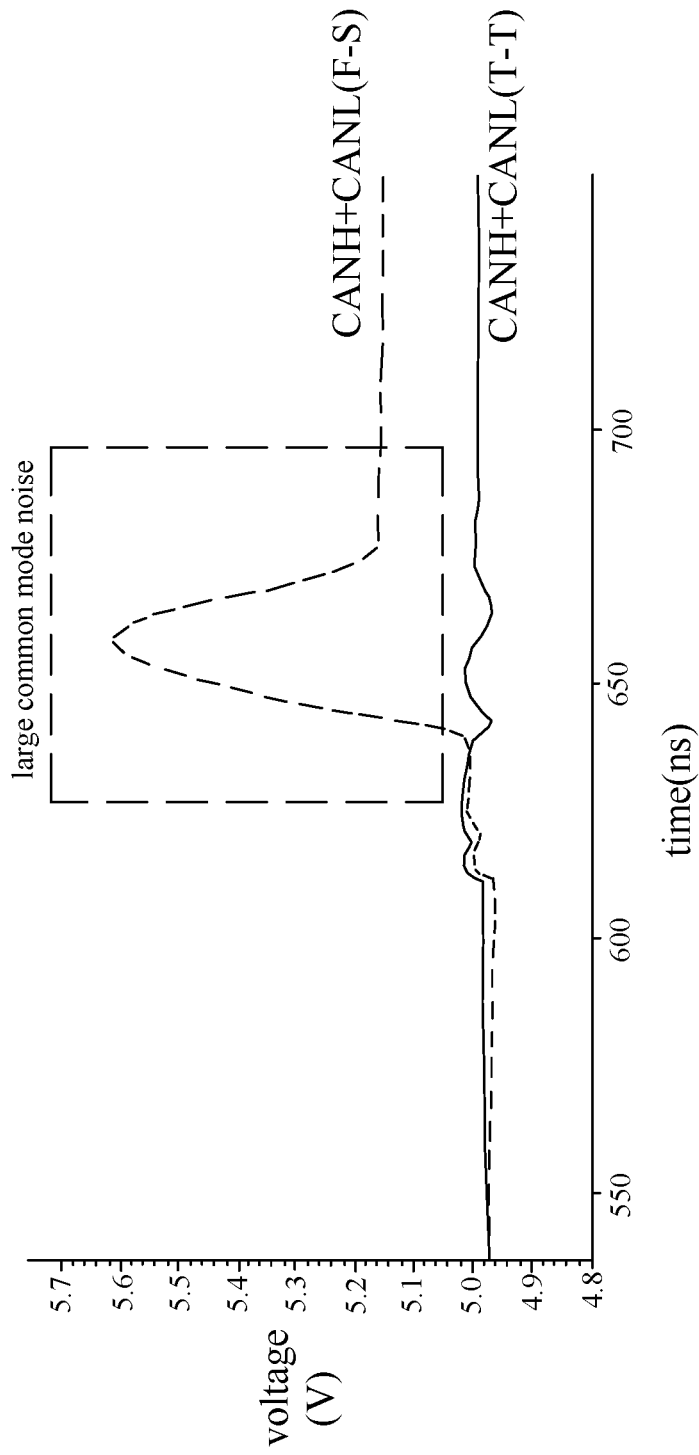
FIG. 10 shows waveforms of a summation of the high side output CANH and low side output CANL in FIG. 9 in which a process variation occurs.

In addition, please find FIG. 8 when only one auxiliary switch is configured in each of the first and second pathway controlled unit for switching the first phase state to the second phase state. It had been proposed that if the gate of the transistor employed by the auxiliary switch is controlled with gate slope control mechanisms, i.e. a slowly increasing and slowly decreasing gate input signal, the objective of smooth transition could have been realized. However, it draws our attention that if a process variation of the transistor employed by the auxiliary switch occurs, for example, operations of the MOSFET vary from T-T (typical-typical) to F-S (fast-slow) or S-F (slow-fast) state, then the symmetry of its output signal comprising CANH, as well as CANL, would be highly affected. Please refer to FIG. 9 and FIG. 10, which show waveforms of the output bus signal $V_{out}$ composed of the high side output CANH and low side output CANL in FIG. 8, in which the MOSFET of the auxiliary switch in FIG. 8 encounters process variation. Among these experimental simulation results, the solid line curve indicates that the MOSFET corner is in the T-T situation, while the dashed line curve indicates that the MOSFET corner is in the F-S situation. It is apparent and proved that when entering the F-S situation due to the MOSFET process variation, an extremely large common mode noise as an indicated square shown in FIG. 10 is always unexpected and inevitable.

Figure 11:
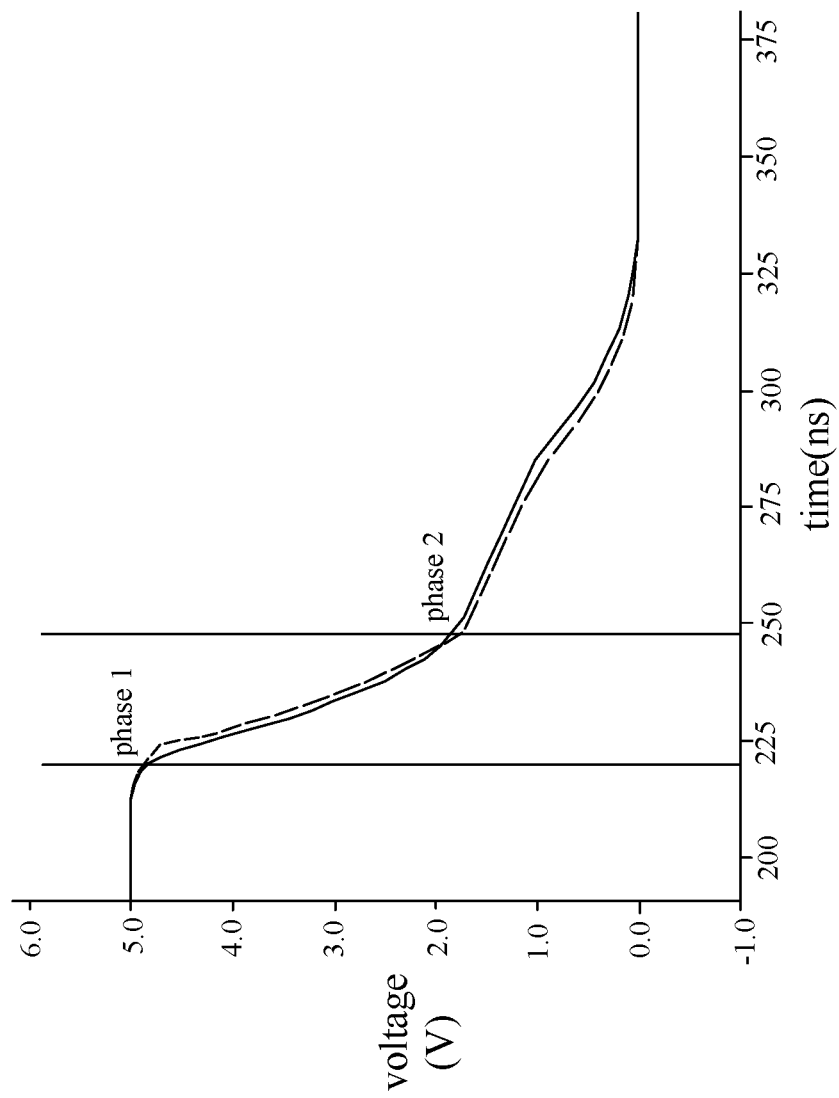
FIG. 11 shows waveforms of the side switching voltage signals $V_s$ in comparison with circuit diagrams in FIG. 4 and FIG. 8.
Figure 12:
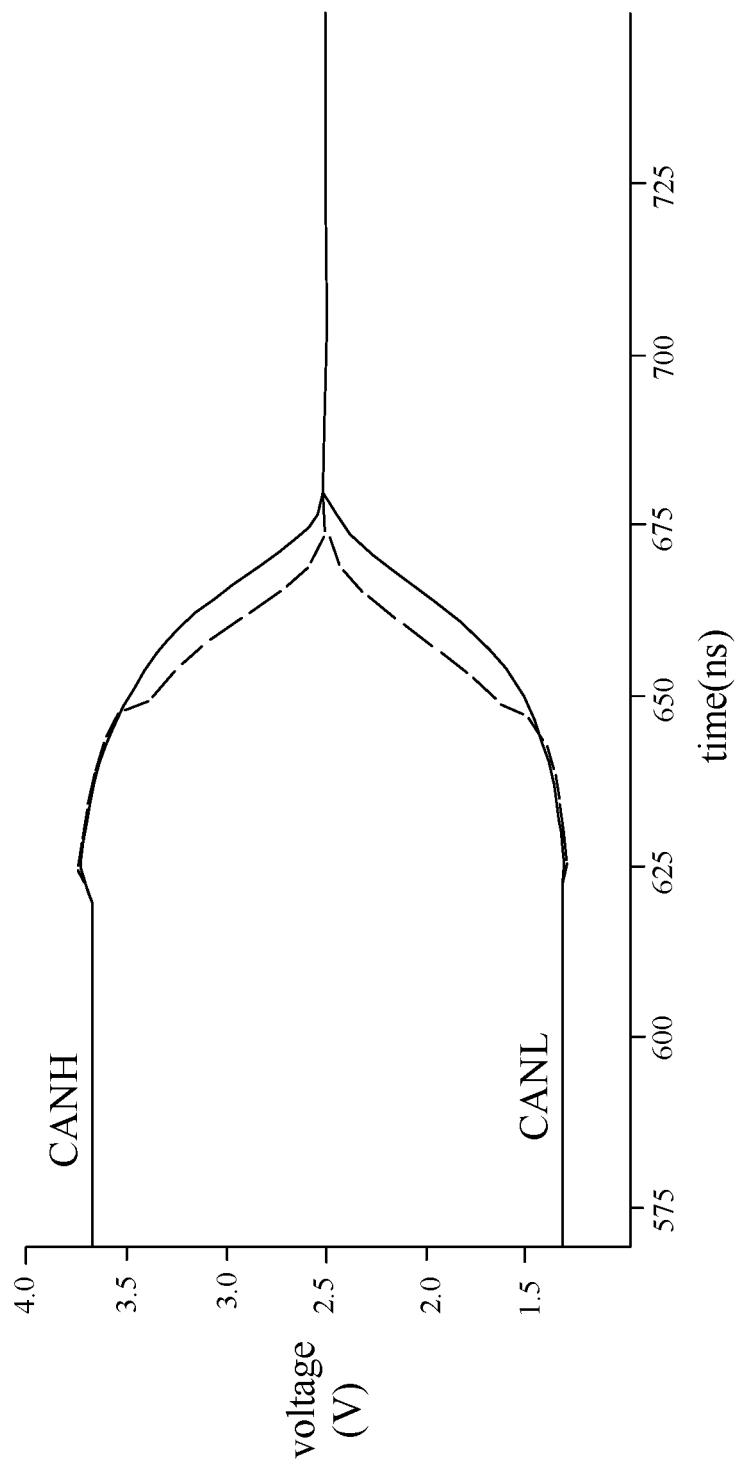
FIG. 12 shows waveforms of the output bus signal $V_{out}$ composed of a high side output CANH and a low side output CANL in comparison with circuit diagrams in FIG. 4 and FIG. 8.

On the other hand, FIG. 11 shows waveforms of the side switching voltage signals $V_s$ in comparison with circuit diagrams in FIG. 4 and FIG. 8. FIG. 12 shows waveforms of the output bus signal $V_{out}$ composed of the high side output CANH and the low side output CANL in comparison with circuit diagrams in FIG. 4 and FIG. 8. Among these two figures in FIG. 11 and FIG. 12 showing the experimental simulation results, the solid line curve indicates a waveform of the voltage signals in FIG. 4 when a plurality of auxiliary switches SW1b, SW1c . . . SW1n and SW2b, SW2c . . . SW2n are disposed, while the dashed line curve indicates a waveform of the voltage signals in FIG. 8 when only one first/second auxiliary switch SW1b, SW2b are disposed.

From these simulation results, it is apparent and evident that, if only one auxiliary switch is configured in the circuit diagram for switching the first phase state to the second phase state, the turning point of the transition would be too sharp as indicated by the dashed line. In addition, the output bus signal $V_{out}$, comprising the high side output CANH as well as the low side output CANL, is not smooth at all, leading to electrical loss and/or high common mode noise.

On the contrary, as indicated by the solid line curves shown in FIG. 11 and FIG. 12, when multiple auxiliary switches are configured in the circuit diagram for switching the first phase state to the second phase state, then the turning point of the transition would be progressively smooth. Meanwhile, the voltage curves of the output bus signal $V_{out}$, comprising the high side output CANH as well as the low side output CANL, are smooth enough during the transition period, which is beneficial for resulting in both the phase accelerating transition and smoothing transition for controller area network bus application systems. As a result, the objective of the present invention which is aimed to perform excellent DC level control of the high level output CANH and the low level output CANL can be successfully achieved as well.

Therefore, based on at least one proof provided above, it is believed that the proposed transition controlled circuit of the present invention is characterized by utilizing a plurality of auxiliary switches, which can be sophisticatedly controlled to turn on and off sequentially, so as to control voltages of its output signal transit from a first phase state to a second phase state and the transition can be smooth. Under such circumstances, not only a smooth transition, but also a low common mode noise and better EMI performance can all be retrieved. As such, by employing the proposed circuit diagram, the present invention is believed as beneficial to controlling DC voltage level stability of output voltages and thus can be widely utilized to not only controller area network buses but also other industrial application systems as an extraordinarily performing transition controlled circuit design switching between a dominant mode and a recessive mode.

The proposed circuit structure of the present invention can be applied either to a high side, generating the high side output CANH, or to a low side, generating the low side output CANL.

As a result, when compared to the prior arts, it is obvious that the present invention apparently shows much more effective performances than before. In addition, it is believed that the present invention is instinct, effective and highly competitive for IC technology and industries in the market nowadays, whereby having extraordinary availability and competitiveness for future industrial developments and being in condition for early allowance.

It will be apparent to those skilled in the art that various modifications and variations can be made to the present invention without departing from the scope or spirit of the invention. In view of the foregoing, it is intended that the present invention cover modifications and variations of this invention provided they fall within the scope of the invention and its equivalent.

What is claimed is:

1. A bus driver module with controlled circuit, generating an output bus signal and electrically connected to a controller area network, comprising:
   a transition controlled circuit, electrically connected to an input terminal and comprising a first pathway controlled unit connected in parallel with a second pathway controlled unit for generating a side switching voltage, each of said first pathway controlled unit and said second pathway controlled unit comprising a plurality of switches, wherein said first pathway controlled unit is connected between said input terminal, said side switching voltage and a ground voltage, and said first pathway controlled unit comprises at least one first main switch and multiple first auxiliary switches connected in parallel;
   at least one switch control circuit, being connected between said input terminal and said first pathway controlled unit for generating a plurality of first control signals, wherein each of said first control signals determines an on and off state of each of said first auxiliary switches, and wherein said switch control circuit comprises a pulse generator and a pulse sequential delay circuit in series connection with said pulse generator, said pulse generator receives said input signal and generates a pulse signal, said pulse sequential delay circuit receives said pulse signal and outputs the plurality of first control signals for controlling said plurality of first auxiliary switches accordingly, and wherein said pulse generator comprises:
an inverter, having a first end connected to said input terminal and a second end;
a capacitor, connected between said second end of said inverter and said ground voltage;
a comparator having two input ends respectively connected to said second end of said inverter and a reference voltage, and one output end; and
an AND gate having two input ends respectively connected to said input terminal and said output end of said comparator and generating said pulse signal; and
an output driver being connected in series with said transition controlled circuit and receiving said side switching voltage so as to accordingly generate said output bus signal,
wherein when an input signal is injected through said input terminal, either said first pathway controlled unit or said second pathway controlled unit is active, and the plurality of switches of either said first pathway controlled unit or said second pathway controlled unit are sequentially turned on and off such that said side switching voltage encounters a smooth phase transition.

2. The bus driver module with controlled circuit according to claim 1, wherein each of said first main switch and said first auxiliary switches is further connected to an impedance component.

3. The bus driver module with controlled circuit according to claim 1, wherein when said input signal is turning from logic 0 to 1, said first main switch is turned on first and said first pathway controlled unit is active, said first auxiliary switches are then turned on sequentially such that a voltage value of said side switching voltage varies in a first phase state.

4. The bus driver module with controlled circuit according to claim 3, wherein after said first phase state of said side switching voltage, said first auxiliary switches are turned off sequentially such that said voltage value of said side switching voltage varies from said first phase state to a second phase state, and said phase transition between said first phase state and said second phase state is smooth.

5. The bus driver module with controlled circuit according to claim 1, wherein said second pathway controlled unit is connected between a supply voltage ($V_{cc}$), said input terminal, and said side switching voltage and comprises at least one second main switch and multiple second auxiliary switches connected in parallel.

6. The bus driver module with controlled circuit according to claim 5, wherein each of said second main switch and said second auxiliary switches is further connected to an impedance component.

7. The bus driver module with controlled circuit according to claim 5, wherein when said input signal is turning from logic 1 to 0, said second main switch is turned on first and said second pathway controlled unit is active, said second auxiliary switches of said second pathway controlled unit are turned on sequentially such that a voltage value of said side switching voltage varies in a first phase state.

8. The bus driver module with controlled circuit according to claim 7, wherein after said first phase state of said side switching voltage, said second auxiliary switches of said second pathway controlled unit are turned off sequentially such that said voltage value of said side switching voltage varies from said first phase state to a second phase state, and said phase transition between said first phase state and said second phase state is smooth.

9. The bus driver module with controlled circuit according to claim 1, wherein said output bus signal for said controller area network bus is a high side output (CANH) or a low side output (CANL).

10. The bus driver module with controlled circuit according to claim 1, wherein said pulse sequential delay circuit comprises multiple delay units, each of said delay units generates one of said first control signals for controlling said corresponding first auxiliary switch, and each said delay unit is a buffer.

11. The bus driver module with controlled circuit according to claim 5, further comprising a second switch control circuit being connected between said input terminal and said second pathway controlled unit for generating a plurality of second control signals, wherein each of said second control signals determines an on and off state of each of said second auxiliary switches.

12. The bus driver module with controlled circuit according to claim 11, wherein said second switch control circuit comprises a second pulse generator and a second pulse sequential delay circuit in series connection with said second pulse generator, said second pulse generator receives said input signal and generates a second pulse signal, said second pulse sequential delay circuit receives said second pulse signal and generates the plurality of second control signals for controlling said plurality of second auxiliary switches accordingly.

13. The bus driver module with controlled circuit according to claim 12, wherein said second pulse sequential delay circuit comprises multiple delay units, each of said delay units generates one of said second control signals for controlling said corresponding second auxiliary switch, and each said delay unit is a buffer.

14. The bus driver module with controlled circuit according to claim 12, wherein said second pulse generator comprises:
another inverter, having a first end thereof connected to said input terminal and a second end;
another capacitor, connected between said second end of said other inverter and said ground voltage;
another comparator having two input ends thereof respectively connected to said second end of said other inverter and a reference voltage, and one output end; and
another AND gate having two input ends thereof respectively connected to said input terminal and said output end of said other comparator and generating said pulse signal.

15. A bus driver module with controlled circuit, generating an output bus signal and electrically connected to a controller area network, comprising:
a transition controlled circuit, electrically connected to an input terminal and comprising a first pathway controlled unit connected in parallel with a second pathway controlled unit for generating a side switching voltage, each of said first pathway controlled unit and said second pathway controlled unit comprising a plurality of switches, wherein said second pathway controlled unit is connected between a supply voltage ($V_{cc}$), said input terminal, and said side switching voltage, and said second pathway controlled unit comprises at least one second main switch and multiple second auxiliary switches connected in parallel;

at least one switch control circuit, being connected between said input terminal and said second pathway controlled unit for generating a plurality of second control signals, wherein each of said second control signals determines an on and off state of each of said second auxiliary switches, and wherein said switch control circuit comprises a pulse generator and a pulse sequential delay circuit in series connection with said pulse generator, said pulse generator receives said input signal and generates a pulse signal, said pulse sequential delay circuit receives said pulse signal and outputs the plurality of second control signals for controlling said plurality of second auxiliary switches accordingly, and wherein said pulse generator comprises:

an inverter, having a first end connected to said input terminal and a second end;

a capacitor, connected between said second end of said inverter and said ground voltage;

a comparator having two input ends respectively connected to said second end of said inverter and a reference voltage, and one output end; and an AND gate having two input ends respectively connected to said input terminal and said output end of said comparator and generating said pulse signal; and an output driver being connected in series with said transition controlled circuit and receiving said side switching voltage so as to accordingly generate said output bus signal, wherein when an input signal is injected through said input terminal, either said first pathway controlled unit or said second pathway controlled unit is active, and the plurality of switches of either said first pathway controlled unit or said second pathway controlled unit are sequentially turned on and off such that said side switching voltage encounters a smooth phase transition.

16. The bus driver module with controlled circuit according to claim 15, wherein said first pathway controlled unit is connected between said input terminal, said side switching voltage and a ground voltage, and comprises at least one first main switch and multiple first auxiliary switches connected in parallel.

17. The bus driver module with controlled circuit according to claim 16, wherein each of said first main switch and said first auxiliary switches is further connected to an impedance component.

18. The bus driver module with controlled circuit according to claim 16, wherein when said input signal is turning from logic 0 to 1, said first main switch is turned on first and said first pathway controlled unit is active, said first auxiliary switches are then turned on sequentially such that a voltage value of said side switching voltage varies in a first phase state.

19. The bus driver module with controlled circuit according to claim 18, wherein after said first phase state of said side switching voltage, said first auxiliary switches are turned off sequentially such that said voltage value of said side switching voltage varies from said first phase state to a second phase state, and said phase transition between said first phase state and said second phase state is smooth.

20. The bus driver module with controlled circuit according to claim 15, wherein each of said second main switch and said second auxiliary switches is further connected to an impedance component.

21. The bus driver module with controlled circuit according to claim 15, wherein when said input signal is turning from logic 1 to 0, said second main switch is turned on first and said second pathway controlled unit is active, said second auxiliary switches of said second pathway controlled unit are turned on sequentially such that a voltage value of said side switching voltage varies in a first phase state.

22. The bus driver module with controlled circuit according to claim 21, wherein after said first phase state of said side switching voltage, said second auxiliary switches of said second pathway controlled unit are turned off sequentially such that said voltage value of said side switching voltage varies from said first phase state to a second phase state, and said phase transition between said first phase state and said second phase state is smooth.

23. The bus driver module with controlled circuit according to claim 15, wherein said output bus signal for said controller area network bus is a high side output (CANH) or a low side output (CANL).

24. The bus driver module with controlled circuit according to claim 16, wherein another switch control circuit is connected between said input terminal and said first pathway controlled unit for generating a plurality of first control signals, wherein each of said first control signals determines an on and off state of each of said first auxiliary switches.

25. The bus driver module with controlled circuit according to claim 24, wherein said other switch control circuit comprises another pulse generator and another pulse sequential delay circuit in series connection with said other pulse generator, said other pulse generator receives said input signal and generates another pulse signal, said other pulse sequential delay circuit receives said other pulse signal and outputs the plurality of first control signals for controlling said plurality of first auxiliary switches accordingly.

26. The bus driver module with controlled circuit according to claim 25, wherein said other pulse sequential delay circuit comprises multiple delay units, each of said delay units generates one of said first control signals for controlling said corresponding first auxiliary switch, and each said delay unit is a buffer.

27. The bus driver module with controlled circuit according to claim 25, wherein said other pulse generator comprises:

another inverter, having a first end thereof connected to said input terminal and a second end;

another capacitor, connected between said second end of said other inverter and said ground voltage;

another comparator having two input ends thereof respectively connected to said second end of said other inverter and said reference voltage, and one output end; and another AND gate having two input ends thereof respectively connected to said input terminal and said output end of said other comparator and generating said pulse signal.

28. The bus driver module with controlled circuit according to claim 15, wherein said pulse sequential delay circuit comprises multiple delay units, each of said delay units generates one of said second control signals for controlling said corresponding second auxiliary switch, and each said delay unit is a buffer.

* * * * *